(12) United States Patent
Nelson

(10) Patent No.: US 8,787,020 B2
(45) Date of Patent: Jul. 22, 2014

(54) MODULE COOLING METHOD AND PLENUM ADAPTOR

(75) Inventor: Eric G. Nelson, Wayne, NJ (US)

(73) Assignee: BAE Systems Information and Electronic Systems Integration Inc., Nashua, NH (US)

(*) Notice: Subject to any disclaimer, the term of this patent is extended or adjusted under 35 U.S.C. 154(b) by 233 days.

(21) Appl. No.: 13/465,198

(22) Filed: May 7, 2012

(65) Prior Publication Data

US 2012/0287575 A1 Nov. 15, 2012

Related U.S. Application Data

(60) Provisional application No. 61/483,968, filed on May 9, 2011.

(51) Int. Cl.
*H05K 7/20* (2006.01)
*B21D 53/02* (2006.01)
*H05K 7/14* (2006.01)

(52) U.S. Cl.
CPC .......... *H05K 7/1412* (2013.01); *H05K 7/20572* (2013.01)
USPC ........................................... 361/695; 361/694

(58) Field of Classification Search
CPC .................................. G06F 1/20; G06F 1/206
USPC .................................................. 361/814–815
See application file for complete search history.

(56) References Cited

U.S. PATENT DOCUMENTS

| | | | | |
|---|---|---|---|---|
| 4,458,296 A | * | 7/1984 | Bryant et al. | 361/691 |
| 5,400,217 A | * | 3/1995 | Whitson et al. | 361/695 |
| 6,797,879 B2 | * | 9/2004 | Leyda et al. | 174/50 |
| 2010/0165571 A1 | * | 7/2010 | Everhart et al. | 361/695 |
| 2011/0194250 A1 | * | 8/2011 | Perkins et al. | 361/690 |

* cited by examiner

*Primary Examiner* — Gregory Thompson
(74) *Attorney, Agent, or Firm* — Daniel J. Long

(57) ABSTRACT

A method and apparatus for cooling modules in a radio system is disclosed. The apparatus comprises an adaptor module with side walls and integrated heat exchanging elements. The adaptor module adapts the air flow from a chassis in the radio system such that the exiting ducting on the chassis efficiently mate with the air conduits in the modules. The adaptor allows the use of new high power density modules in the existing chassis without changing the module design. The use of adaptor module in chassis provides efficient cooling and use less volume in the chassis.

9 Claims, 7 Drawing Sheets

MODULE COOLING METHOD AND PLENUM ADAPTOR

CROSS-REFERENCE TO RELATED APPLICATIONS

This Application claims rights under 35 USC §119(e) from U.S. Application Ser. No. 61/483,968 filed May 9, 2011, the contents of which are incorporated herein by reference.

TECHNICAL FIELD

Embodiments are generally related to modular electronic systems. Embodiments are also related to method and apparatus for cooling modules in modular electronic systems, for example, radio systems. Embodiments are additionally related to a module cooling method and plenum adaptor that mates ducts on existing chassis of modular electronic system with air conduits in new modules.

BACKGROUND OF THE INVENTION

Radio systems have many modular electronics systems for providing radio communications to and from vehicles for example military vehicles and the like. Such modular electronics systems are electrically operated and the power loss from modules and components through which the current flows causes heating of the modular electronics systems. Since such electronic modules and components have only a limited permissible operating temperature range, they are cooled by cooling devices.

The existing Ground Mobile Radio (GMR) Ground Vehicle Aerodynamics (GVA) is designed to accommodate a particular module format which is designed for a free convectional cooling environment. Present modular electronic system designs utilize forced air for cooling. Cooling devices, for example, fans are utilized for circulating air through the electrical components and modules and which thereby dissipate the generated thermal output.

The modular electronics systems are usually mounted on a chassis which have standard conventional ducting arrangements for cooling. Modules which are specifically designed to fit such chassis can only be used in the modular electronic systems. This limits the uses of other module designs, as such modules do not fit into the existing chassis.

The conventional radio systems utilize a standard module that fits only with the existing chassis whereas present radio systems require a new family of modules with higher power densities. Such high density modules do not fit into the existing chassis, for example GVA chassis and occupies more chassis space. Also, the exiting ducting on chassis does not mate with the conduit on the new modules. A need therefore exists for an adapter module that adapts the air flow from the GVA chassis to efficiently mate with the air conduits in the new modules.

BRIEF SUMMARY

The following summary is provided to facilitate an understanding of some of the innovative features unique to the disclosed embodiment and is not intended to be a full description. A full appreciation of the various aspects of the embodiments disclosed herein can be gained by taking the entire specification, claims, drawings, and abstract as a whole.

It is, therefore, one aspect of the present invention to provide for an improved radio systems.

It is another aspect of the disclosed embodiment to provide for methods and apparatus for cooling modules in a radio system.

It is a further aspect of the: disclosed embodiment to provide a method for cooling high power density electronic modules mounted on a existing chassis.

It is a yet another aspect of the disclosed embodiment to provide a plenum adaptor that mates air flow from the modular electronic system with air conduits in the modules.

It is a yet another aspect of the disclosed embodiment to provide an apparatus comprising an adaptor module with side walls and integrated heat exchanging elements.

The aforementioned aspects and other objectives and advantages can now be achieved as described herein. The modular electronic system for example a radio system is disclosed. The system includes a chassis which supports a plurality of modular electronic components. A modular electronic component includes an electronic module with air conduits and an adaptor. The chassis for example GVA chassis has ducts for circulating the forced air. The forced air can be utilized to cool the plurality of modular electronic components.

As high power density modules do not fit into the existing chassis, the adaptor can be utilized with each of the electronic modules. Also, as air conduits in high power density modules do not mate with the ducts in the existing chassis, the adaptor provides efficient cooling of new electronic modules. The adaptor allows air flow from the chassis to efficiently mate with the air conduits in the modules. The present invention incorporates side walls and integrated heat exchanging elements in new modules rather than using fins. The new approach is more efficient and also more compact and uses less volume.

BRIEF DESCRIPTION OF THE DRAWINGS

The accompanying figures, in which like reference numerals refer to identical or functionally-similar elements throughout the separate views and which are incorporated in and form a part of the specification, further illustrate the disclosed embodiments and, together with the detailed description of the invention, serve to explain the principles of the disclosed embodiments.

DETAILED DESCRIPTION

The particular values and configurations discussed in these non-limiting examples can be varied and are cited merely to illustrate at least one embodiment and are not intended to limit the scope thereof.

Figure 1:
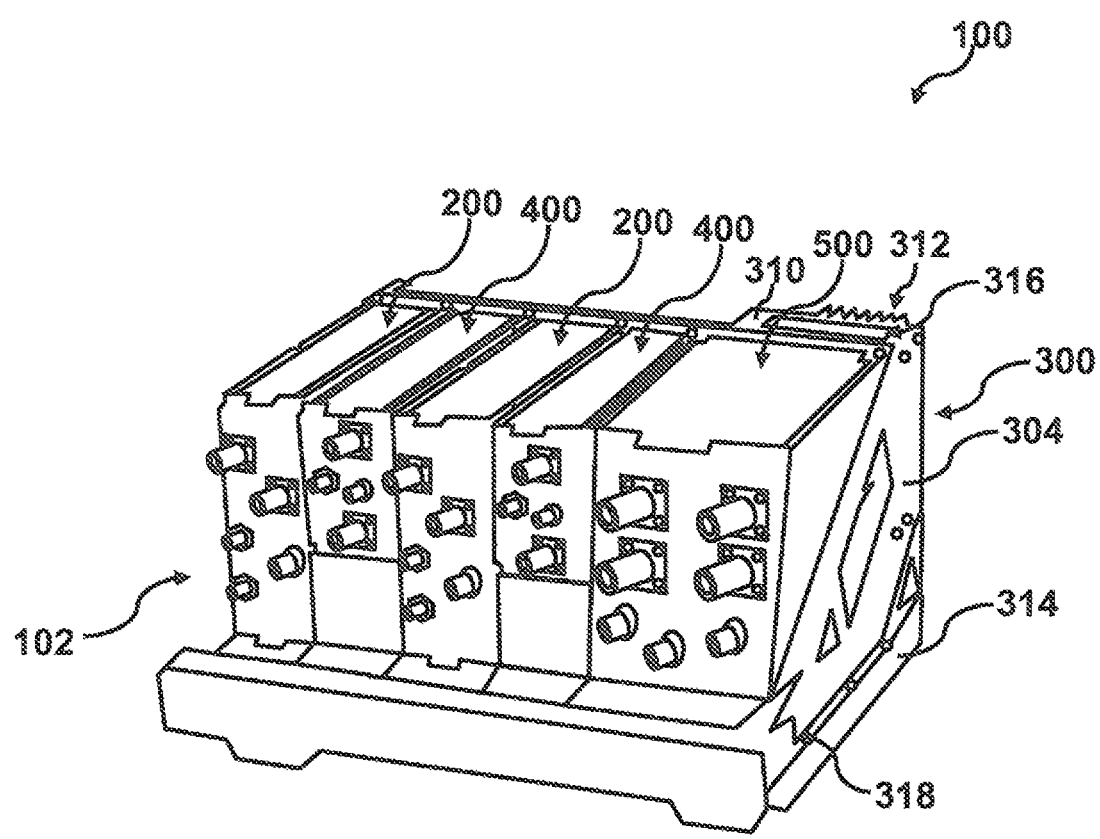
FIG. 1 illustrates a perspective view of a modular electronic system including a plurality of modular electronic components, in accordance with the disclosed embodiments.

Referring to FIG. 1, an exemplary embodiment of an electronics system, for example, a modular electronic radio system 100, is depicted. The modular radio system 100 includes a chassis 300 which supports a plurality of modular electronic components 102. The chassis 300 also includes a power source 316 having a plurality of cooling fins 312 extending from a power source housing 310. Power source 316 provides power to the plurality of modular electronic components 102. The chassis 300 may be coupled to a mount 314 via any of a plurality of means including, but not limited to, pins 318 and further secured by screws and/or other fasteners through apertures for securing the mount 314 and the chassis 300.

The chassis 300 may be formed of any of a variety of materials, including, but not limited to, aluminum. The chassis 300 may alternatively be formed of other adequately rigid materials, such as, but not limited to, metals, metal alloys, polymers, ceramics, and composite materials. The chassis 300 include but not limited to GVA chassis. The chassis 300 include air ducts for cooling the plurality of modular electronic components 102. The side portions 304 of the chassis 300 encase the entire electronics package and also may provide rigidity and strength to chassis 300.

The plurality of modular electronic components 102 are coupled to the chassis 300. A modular electronic component includes an electronic module with air conduits and an adaptor. The electronic modules include but are not limited to, power amplifiers, transceivers, and a Platform Interface Module (PIM). Such modular electronic components 102 adapt the air flow from the chassis 300 to efficiently mate with the air conduits in the modules.

The, system 100 may be configured to meet environmental conditions, for example, those required for military applications. The modules can perform radio system functions; however, the concepts disclosed are not limited to radio systems alone, but may be applied to any of a variety of electronics systems. Varying types of electronic modules with adaptor may be installed in different combinations on chassis 300 to create various end-item configurations. For example, as depicted in FIG. 1, chassis 300 includes a plurality of modular electronic components 102 such as 200, 400 and 500. The modular electronic components 102 such as 200, 400 and 500 depicted in FIG. 1 include transceivers, power amplifiers and a PIM respectively. Each module has an adaptor to adapt the air flow from the chassis 300 and to efficiently mate with the air conduits in the modules. However, chassis 300 may be configured with more or less modular component sites and, further, may include any of a variety of electronic modules.

Figure 2:
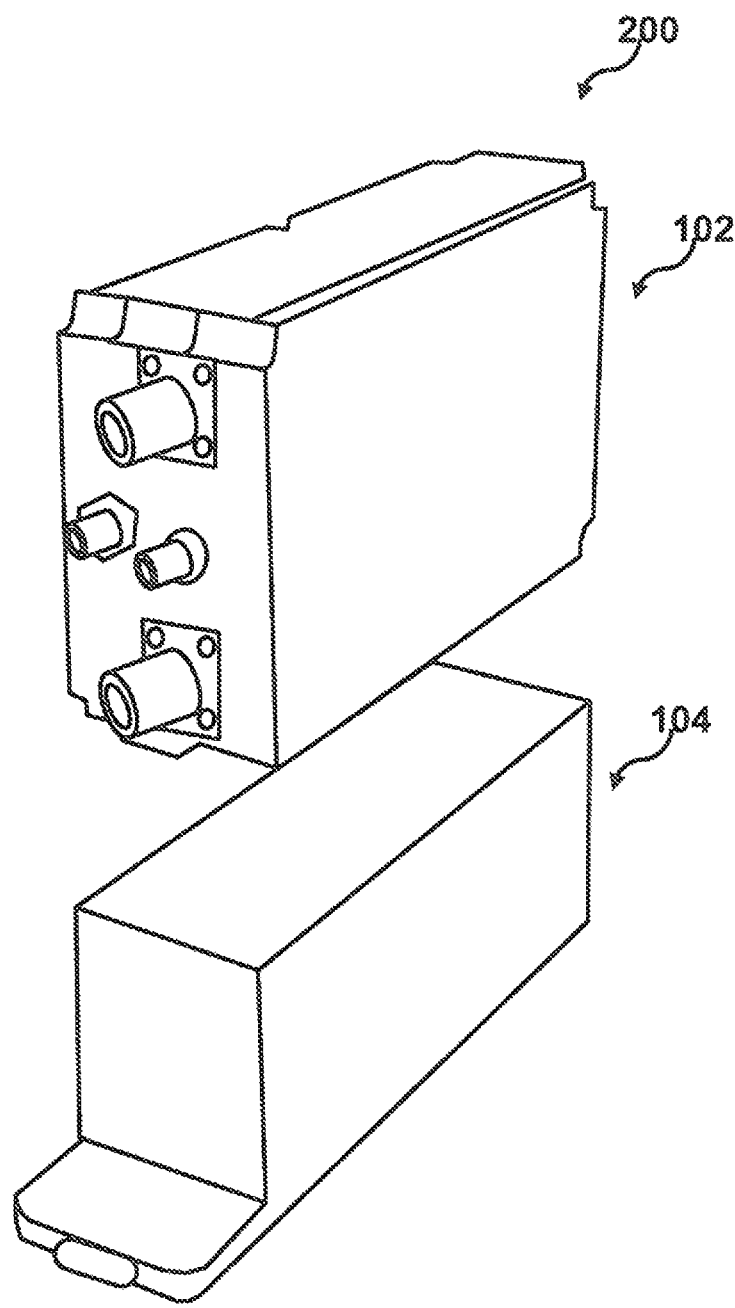
FIG. 2 illustrates a perspective view of a modular electronic component including a transceiver module and an adaptor, in accordance with the disclosed embodiments.

Referring to FIG. 2 a modular electronic component 200 is depicted. The modular electronic component 200 includes an adaptor 104 and an electronic module for example a transceiver 102. The transceiver 102 may include high power density transceivers, such as, but not limited to, Dual Integrated Core Engine Transceiver (DICE-T). Cooling of such transceivers would be difficult as the transceivers do not fit with the existing chassis. An adaptor 104 is utilized to efficiently mate the air flow from the chassis 300 with the air conduits in the transceiver 102.

Figure 3:
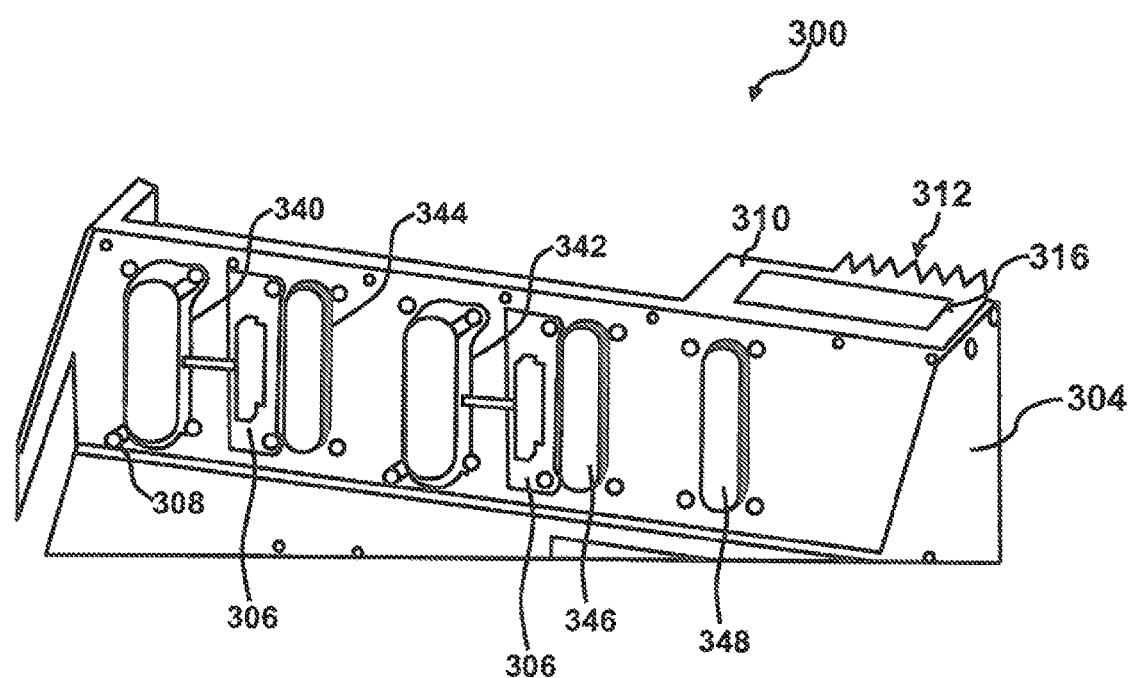
FIG. 3 illustrates a partial perspective, view of an, electronic module chassis, in accordance with the disclosed embodiments.

FIG. 3 illustrates a partial perspective view of the electronic module chassis 300 depicted in FIG. 1, in accordance with the disclosed embodiments. The chassis 300 includes the power source 316 having a plurality of fins 312 for disposing of thermal energy from chassis 300 and generated by power source 316. Chassis 300 also includes a platform 350 (shown in FIG. 4) for supporting the electronic modules 102. Chassis 300 may also include the side portions 304 which may partially encase the entire electronics package and also may provide rigidity and strength to chassis 300. Side portions 304 may be a solid panel as depicted, or further may be a panel including a plurality of apertures and/or openings. Chassis 300 may be an open frame chassis that is designed or configured for installation on existing end platform mounts.

Further, chassis 300 includes a plurality of connectors and/or interfaces 340, 342, 344, 346, 348 and 306 that are utilized to interface a variety of electronic modules. Each connector 340 and 342 supports the modular electronic component 200 which includes the transceiver 102. Similarly, each connector 344 and 346 supports the modular electronic component 400 which includes the power amplifier 402. The connector 348 supports a modular electronic component 500 which includes a PIM. However, any of a variety of connector configurations may be used depending on the end use. Guide pins 308 of the modular electronic component 200 and float connector 306 are shown in FIG. 3. The guide pins in each connector can be utilized to connect the modular electronic components 102 with the chassis 300.

Figure 4:
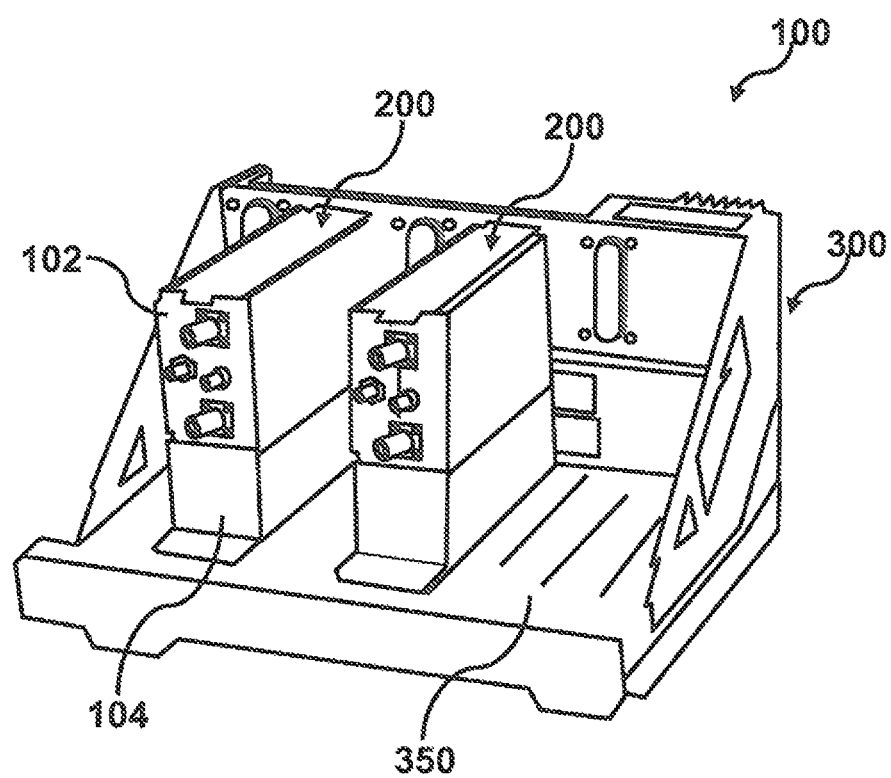
FIG. 4 illustrates a perspective view of a modular electronic system including the modular electronic component depicted in FIG. 2 mounted on the electronic module chassis of FIG. 3, in accordance with the disclosed embodiments.

Referring now to FIG. 4, a system 100 is depicted. System 100 includes two modular electronic components 200, each including a transceiver 102 and an adaptor 104 as depicted in FIG. 2. The modular electronic components 200 are mounted on the platform 350 such that the air conduits in the transceiver 102 efficiently mates with the ducting on the chassis 300. This allows efficient cooling of the transceiver 102. The use of adaptor 104 with transceiver 102 easily fits the transceiver 102 in the existing chassis 300.

Figure 5:
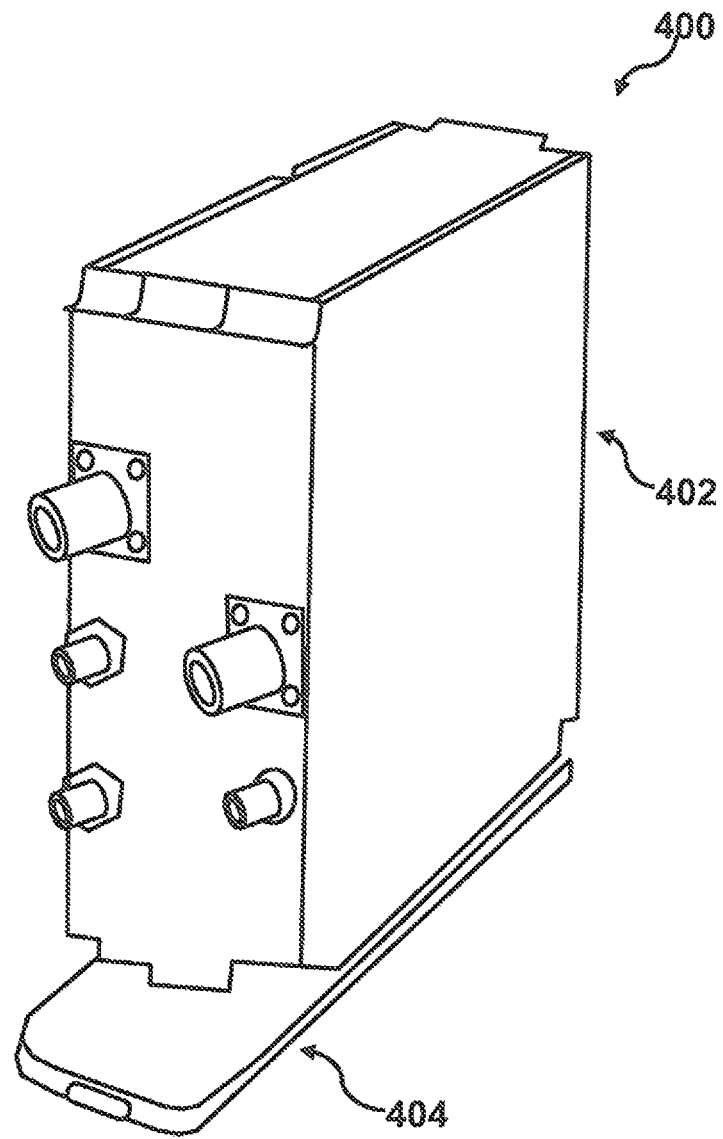
FIG. 5 illustrates a perspective view of a modular electronic component including a power amplifier module and an adaptor, in accordance with the disclosed embodiments.

Referring to FIG. 5, a modular electronic component 400 is depicted. The modular electronic component 400 includes an adaptor 404 and an electronic module for example a power amplifier 402. The power amplifier 402 may include high power density power amplifiers, such as, but not limited to, Universal Power Amplifiers (UPAs). Cooling of such power amplifiers would be difficult as the power amplifiers do not fit with the existing chassis. An adaptor 404 is utilized to efficiently mate the air flow from the chassis with the air conduits in the power amplifier 402.

Figure 6:
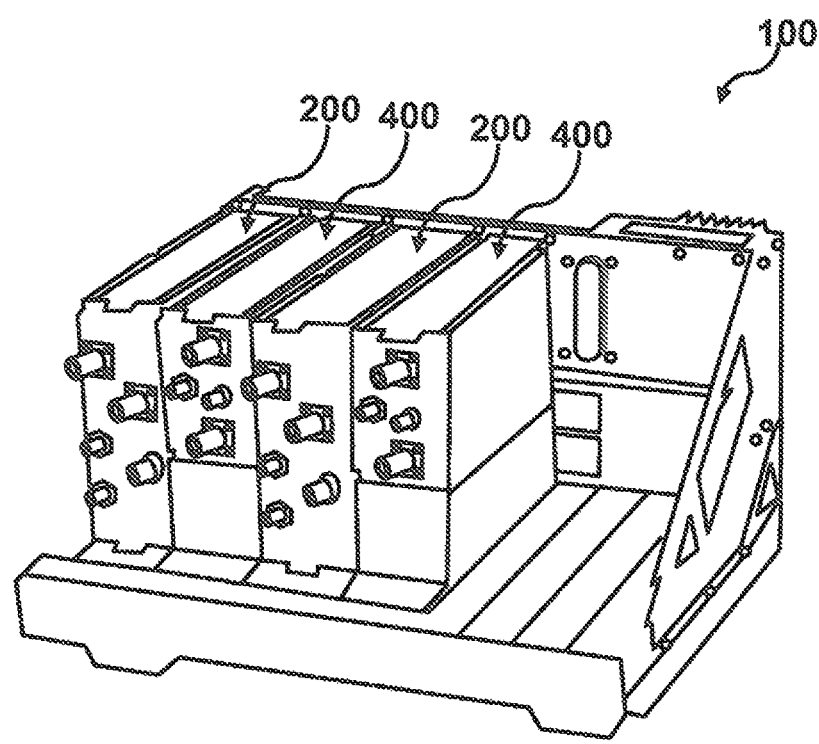
FIG. 6 illustrates a perspective view of a modular electronic system including the modular electronic component depicted in FIG. 5 and the transceiver module depicted in FIG. 2, mounted on the radio chassis of chassis of FIG. 3, in accordance with the disclosed embodiments.

Referring to FIG. 6, a system 100 is depicted. The system 100 includes the modular electronic components 200 and 400. The modular electronic components 400 include a power amplifier 402 and an adaptor 404 as depicted in FIG. 4. The modular electronic components 400 are mounted on the platform 350 such that the air conduits in the power amplifier 402 efficiently mates with the ducting on the chassis 300. This allows efficient cooling of the power amplifier 402. The use of adaptor 404 with power amplifier 402 easily fits the power amplifier 402 in the existing chassis 300.

Figure 7:
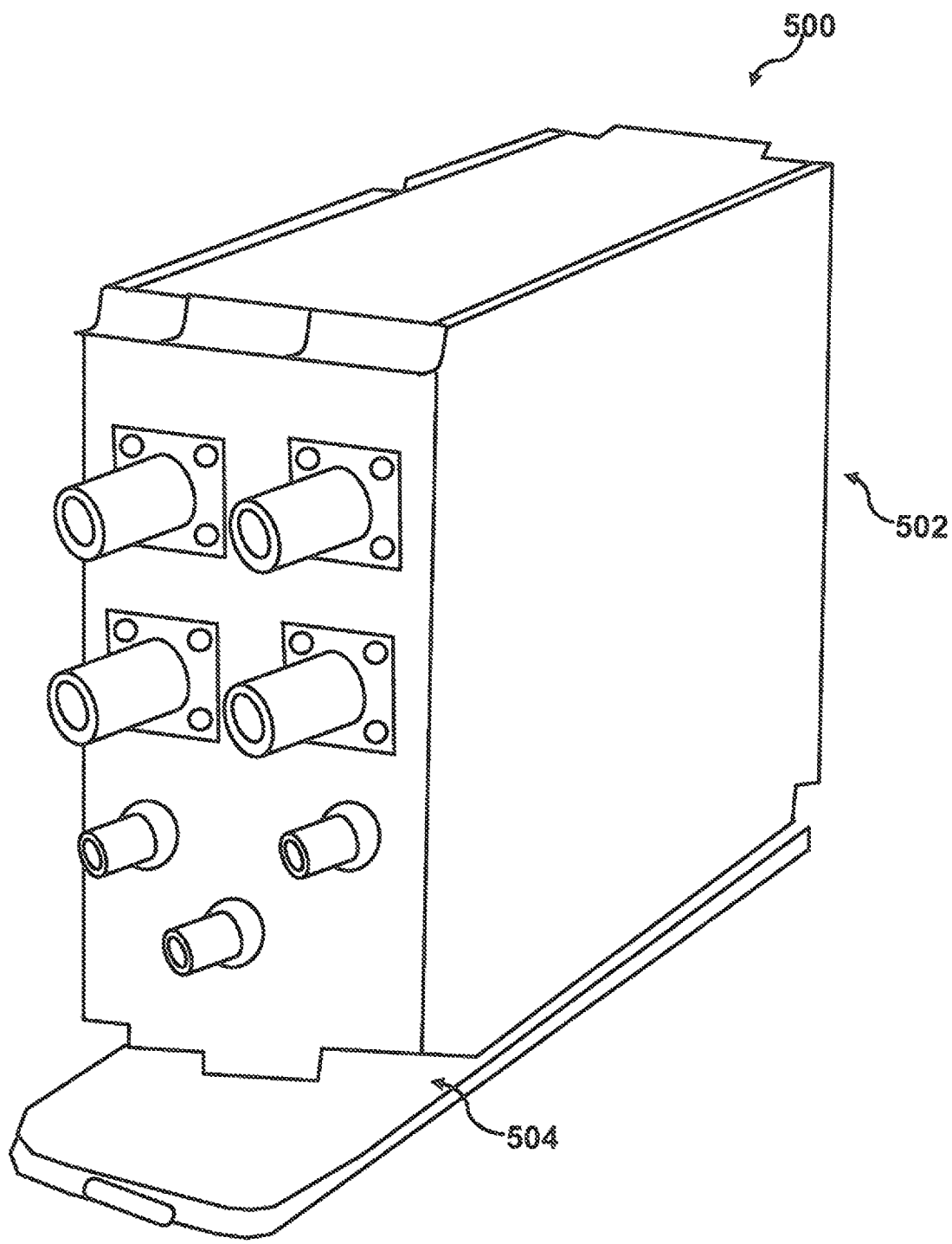
FIG. 7 illustrates a perspective view of a modular electronic component including a network interface module and adaptor, in accordance with the disclosed embodiments.

Referring to FIG. 7, a modular electronic component 500 is depicted. The modular electronic component 500 includes an adaptor 504 and an electronic module for example a PIM 502. The PIM 502 may include a high power density interfacing modules, such as, but not limited to, a Network Interface Unit (MU). Cooling of such PIM 502 would be difficult as the PIM 502 do not fit with the existing chassis. An adaptor 504 is utilized to efficiently mate the air flow from the chassis 300 with the air conduits in the PIM 502.

Thus, it is clear that the electronics system 100 depicted may be configured in any of a variety of manners and may further be reconfigured using a different combination of modular electronic components. Finally, after mounting the electronic components 200, 300 and 500 on the chassis 300 to form the system 100 depicted in FIG. 1. The system 100 described above form radio systems, however, the modular electronics systems may be used to form other types of electronics systems.

It will be appreciated that variations of the above disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A module in a modular electronic system, comprising an electronic device with a plurality of cooling conduits;
    an adaptor for supporting said electronic device, wherein said adaptor allows said cooling conduits to efficiently mate with a plurality of ducts in an electronic module housing utilized in said modular electronic system.

2. The module of claim 1, wherein said plurality of ducts in said electronic module housing is utilized to cool said electronic device.

3. The module of claim 1, wherein said adaptor allows said plurality of cooling conduits to match with ducts in said electronic device for cooling said electronic device.

4. The module of claim 1, wherein said electronic device comprises a high power density device.

5. A modular electronic system, comprising:
    a plurality of modules, at least one of said modules comprising an electronic device with a plurality of cooling conduits and an adaptor for supporting said electronic device;
    an electronic module housing for supporting said plurality of modules comprising a plurality of ducts for cooling said electronic device, wherein said adaptor allows said plurality of cooling conduits to efficiently mate with said plurality of ducts in said electronic module housing;
    an electrical connector coupled to said electronic device and supported by said housing; and
    a power supply supported by said housing.

6. The system of claim 5, wherein said adaptor allows said plurality of cooling conduits to match with said plurality of ducts in said electronic device for cooling said electronic device.

7. The system of claim 5, wherein said electronic device comprises a high power density device.

8. A method for cooling modules in modular electronic systems, comprising:
    installing a plurality of modules, at least one of said modules comprising an electronic device with a plurality of cooling conduits and an adaptor for supporting said electronic device, wherein said adaptor allows said cooling conduits to efficiently mate with a plurality of ducts in an electronic module housing utilized in said modular electronic systems;
    circulating air through said plurality of ducts in said electronic module housing; and
    forcing air through said cooling conduits such that said plurality of modules are cooled.

9. A method for fabricating modules in a modular electronic system, comprising:
    forming an electronic device with a plurality of cooling conduits;
    incorporating side walls and integrated heat exchanging elements in said electronic device; and
    incorporating adaptor in said electronic device such that said adaptor allows said cooling conduits to efficiently mate with a plurality of ducts in an electronic module housing utilized in said modular electronic system.

* * * * *